(12) United States Patent
Kelly et al.

(10) Patent No.: US 8,508,023 B1
(45) Date of Patent: Aug. 13, 2013

(54) SYSTEM AND METHOD FOR LOWERING CONTACT RESISTANCE OF THE RADIO FREQUENCY (RF) SHIELD TO GROUND

(75) Inventors: Michael G. Kelly, Queen Creek, AZ (US); John Cambas, Muntiulopa (PH); Francis Tan, Binan (PH); Pam Montero, Davao (PH)

(73) Assignee: Amkor Technology, Inc., Chandler, AZ (US)

( * ) Notice: Subject to any disclaimer, the term of this patent is extended or adjusted under 35 U.S.C. 154(b) by 235 days.

(21) Appl. No.: 12/817,923

(22) Filed: Jun. 17, 2010

(51) Int. Cl.
*H01L 23/552* (2006.01)
*H01L 23/04* (2006.01)
*H01L 23/24* (2006.01)
*H01L 21/00* (2006.01)

(52) U.S. Cl.
USPC .... 257/659; 257/698; 257/728; 257/E23.114; 257/E23.011; 438/124

(58) Field of Classification Search
USPC ......... 257/659, 660, 768, 690, 684, 698–699, 257/E23.114; 361/816, 818; 438/127
See application file for complete search history.

(56) References Cited

U.S. PATENT DOCUMENTS

| | | | |
|---|---|---|---|
| 4,925,024 A | 5/1990 | Ellenberger et al. | |
| 5,166,772 A | 11/1992 | Soldner et al. | |
| 5,416,358 A | 5/1995 | Ochi et al. | |
| 5,468,999 A | 11/1995 | Lin et al. | |
| 5,473,191 A | 12/1995 | Tanaka | |
| 5,557,142 A | 9/1996 | Gilmore et al. | |
| 5,614,694 A | 3/1997 | Gorenz, Jr. et al. | |
| 5,639,989 A * | 6/1997 | Higgins, III | 174/386 |
| 5,656,864 A | 8/1997 | Mitsue et al. | |
| 5,694,300 A | 12/1997 | Mattei et al. | |
| 5,796,589 A * | 8/1998 | Barrow | 361/774 |
| 5,907,477 A | 5/1999 | Tuttle et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,602,737 B2 | 8/2003 | Wu | |
| 6,686,649 B1 * | 2/2004 | Mathews et al. | 257/659 |
| 7,030,469 B2 | 4/2006 | Mahadevan et al. | |
| 7,482,686 B2 * | 1/2009 | Zhao et al. | 257/710 |
| 7,629,674 B1 * | 12/2009 | Foster | 257/659 |
| 2002/0089832 A1 | 7/2002 | Huang | |
| 2002/0167060 A1 * | 11/2002 | Buijsman et al. | 257/423 |
| 2003/0067757 A1 | 4/2003 | Richardson et al. | |

(Continued)

*Primary Examiner* — Matthew Landau
*Assistant Examiner* — Khaja Ahmad
(74) *Attorney, Agent, or Firm* — McAndrews, Held & Malloy

(57) ABSTRACT

A semiconductor device has a substrate having a plurality of metal traces. A die is electrically attached to a first surface of the substrate. A first plurality of segmented metal traces is formed around a perimeter of the first surface of the substrate, wherein an end section of the first plurality of segmented metal traces is exposed. A mold compound is used for encapsulating the semiconductor device. A first metal plating is formed on a top terminal end section of the first plurality of segmented metal traces. The first metal plating is spread to at least one of the mold compound or the exposed end sections of the first plurality of segmented metal traces. A conductive coating is applied to the mold compound, the exposed end sections of the first plurality of segmented metal traces and to the first metal plating.

20 Claims, 10 Drawing Sheets

(56) References Cited

U.S. PATENT DOCUMENTS

| | | | |
|---|---|---|---|
| 2004/0231872 A1* | 11/2004 | Arnold et al. ............... 174/35 R |
| 2005/0280139 A1 | 12/2005 | Zhao et al. |
| 2007/0030661 A1 | 2/2007 | Morris et al. |
| 2007/0176281 A1 | 8/2007 | Kim |

* cited by examiner

US 8,508,023 B1

SYSTEM AND METHOD FOR LOWERING CONTACT RESISTANCE OF THE RADIO FREQUENCY (RF) SHIELD TO GROUND

FIELD OF THE INVENTION

This invention relates to Radio Frequency (RF) shielding and, more specifically, to a system and method that lowers the electrical resistance of the RE shield to ground by lowering the contact resistance.

BACKGROUND OF THE INVENTION

Radio Frequency (RF) shielding may be required on certain semiconductor devices and modules (hereinafter semiconductor device) in order to minimize Electro-Magnetic Interference (EMI) radiation from the semiconductor device. RF shielding is further required to prevent RF radiation from external sources from interfering with operation of the semiconductor device RF shielding is generally accomplished in one of three ways. A first method is to attach a metal can over the component after the component is attached to the motherboard. An alternative to the shield attached method is an embedded RF shield. In an embedded shield, the metal RF shield is directly attached to the semiconductor package substrate by means of solder or a conductive adhesive. The shield may be fully embedded within the mold compound of the finished package or can be exposed after assembly. The third method is the conventional conformal shield. In this method, all of the components are placed on the substrate and the substrate, or strip, is over-molded using unit molding, or pin gate molding where individual mold caps are defined within the strip such that upward facing, exposed pads in the substrate remain exposed after the mold operation. A conductive coating is then applied to the strip such that it covers the units and also makes electrical contact to the upward facing pads. The strip is then singulated into individual units.

RF shielding is strongly impacted by the electrical resistance of the RF shield to ground. This resistance is comprised of the resistance of the RF shield, connection of the RF shield to ground, know as contact resistance, and trace resistance. The contact resistance is generally dictated by the amount of corrosion and or oxidation that may form on the exposed metal traces and or ground planes prior to connection of the RF shield to the exposed metal traces and or ground planes.

Therefore, a need existed to provide a system and method to overcome the above problem. The system and method would lower the electrical resistance of the RF shield to ground by lowering the contact resistance.

SUMMARY OF THE INVENTION

A semiconductor device has a substrate having a plurality of metal traces. A die is electrically attached to a first surface of the substrate. A first plurality of segmented metal traces is formed around a perimeter of the first surface of the substrate, wherein an end section of the first plurality of segmented metal traces is exposed. A mold compound is used for encapsulating the semiconductor device. A first metal plating is formed on a top terminal end section of the first plurality of segmented metal traces. The first metal plating is spread to at least one of the mold compound or the exposed end sections of the first plurality of segmented metal traces. A conductive coating is applied to the mold compound, the exposed end sections of the first plurality of segmented metal traces and to the first metal plating.

A semiconductor device has a substrate having a plurality of metal traces. At least one die is electrically attached to a first surface of the substrate. A plurality of channels is formed around a perimeter of the first surface of the substrate and through the substrate, an interior of the channels is exposed. A mold compound is used for encapsulating the semiconductor device. A metal plating is formed on the interior of the channels, wherein the metal plating is spread to at least one of sections of the mold compound or exposed metal traces coupled to the channels. A conductive coating is applied to the mold compound, exposed metal traces, the metal plating on the interior of the channels, and the metal plating spread to at least one of sections of the mold compound or exposed metal traces coupled to the channels.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
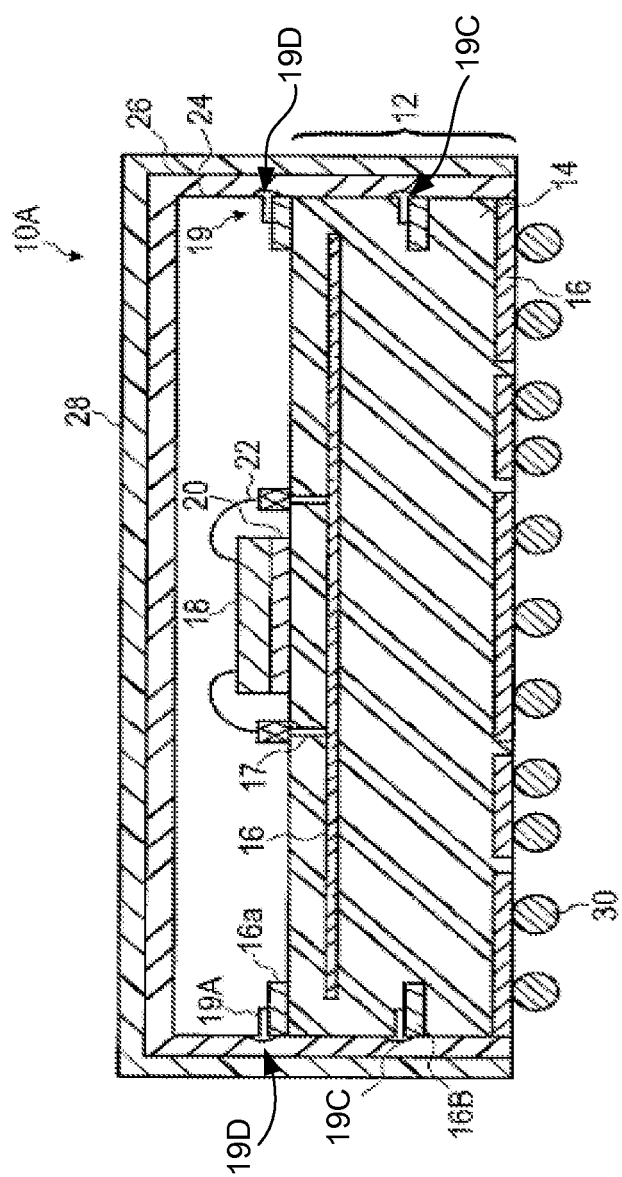
FIG. 1 is a cross-sectional side view of one embodiment of the semiconductor device of the present invention.
Figure 2:
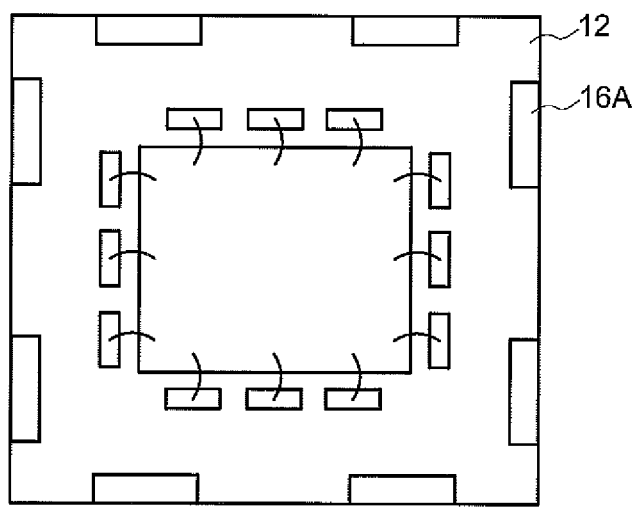
FIG. 2 is a top view of the semiconductor device of FIG. 1 with the mold compound removed.
Figure 3:
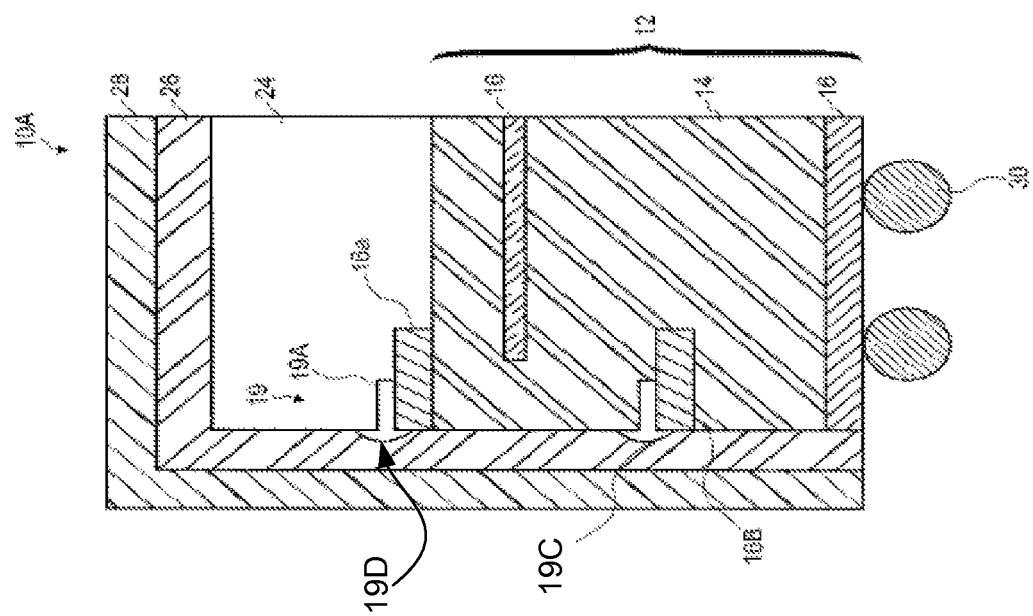
FIG. 3 is a magnified view showing the connection between the RF shield to the ground.

Referring to FIGS. 1-3, a semiconductor device 10A (hereinafter device 10A) will be described. The device 10A may have a substrate 12. The substrate 12 may be any one chosen from a conventional rigid PCB, a flexible PCB, and an equivalent thereof, but the kind of substrate 12 is not limited herein. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. The number of metal traces 16 is not limited to the number shown in the FIG. 1. If multiple layers of metal traces 16 are formed, a dielectric layer may be applied between the metal traces 16. The dielectric layer may be used as an insulating layer to separate two signal layers. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

The device 10A may not have a dedicated ground plane to attach an RF shield. Instead, a plurality of segmented metal traces 16A may be formed around a perimeter of device 10A on a top surface of the substrate 12. Segmented metal traces 16B may also be formed within the insulation layer 14 of the substrate 12 around a perimeter of the device 10A. The segmented metal traces 16A and 16B may be used to connect the RF shield to ground. In general, the exposed surface area of the segmented metal traces 16A and 16B may be substantially smaller than the total perimeter of the device 10A. As shown more clearly in FIG. 2, eight segmented metal traces 16A are formed around a perimeter of a first surface of the substrate 12. Since the segmented metal traces 16A and 16B may be substantially smaller than the total perimeter of the device 10A, contact resistance may be a concern. The exposed metal of the segmented metal traces 16A and 16B have a tendency to oxidize. This causes the electrical resistance to increase. Thus, contact between the segmented metal traces 16A and 16B and the RF shield may be compromised.

To lower the electrical resistance, metal plating 19 may be applied to the segmented metal traces 16A formed on the first surface of the substrate 12. In the present embodiment, the metal plating 19 is applied to a top surface of the segmented metal traces 16A on the terminal ends thereof. The metal plating 19 may be used to lower the electrical resistance of the RF shield to ground by lowering the contact resistance. In accordance with one embodiment, the metal plating 19 may be a noble metal 19A or a combination of noble metals. Noble metals are metals that are resistant to corrosion and oxidation and thus have inherently low electrical resistance which in turn lowers the contact resistance to the RF shield. Some examples of noble metals include but are limited to: gold, silver, platinum, palladium, nickel, and combinations thereof.

The metal plating 19 is generally a softer metal than that of the segmented metal traces 16A. Thus, when the device 10A is singulated, the metal plating 19 has a tendency to smear and spread, indicated by 19D in FIG. 1, thereby increasing the available surface area to contact with the RF shield as will be discussed below.

The metal plating 19 may also be applied to the segmented metal traces 16B formed within the insulation layer 14 of the substrate 12. The metal plating 19 may be applied to a top surface of the segmented metal traces 16B on the terminal ends thereof.

One or more die 18 may be attached to a first surface of the first substrate 12. The die 18 may be a memory device, a logic device, an ASIC device, and other like elements. It should be noted that the listing of the above types of die 18 is given as an example and should not be seen as to limit the scope of the present invention. The die 18 may be coupled to the first surface of the first substrate 12 in a plurality of different manners. In the embodiment shown in FIG. 1, an adhesive 20 may be used to couple the electronic components 18 to the first substrate 12. The adhesive 20 may be an adhesive film, an epoxy, or the like. The listing of the above adhesive types should not be seen as to limit the scope of the present invention. The die 18 may then be electrically coupled to the first substrate 12 through the use of wirebonds 22. Alternatively, the electronic components 18 may be coupled to the substrate 12 through flip chip bonding, surface mount technology (SMT) or the like.

A mold compound 24 may be used to encapsulate the device 10A. The mold compound 24 may be made of a thermosetting plastic material like epoxy. The mold compound 24 may be used to encapsulate the components of the device 10A (i.e., die 18, the wirebonds 22, and exposed areas of the first surface of the substrate 12).

As previously stated, when the device 10A is singulated, the metal plating 19 has a tendency to smear and thus spread thereby increasing the available surface area to contact with the RF shield. As more clearly shown in FIG. 3, during singulation, the metal plating 19 has a tendency to smear and thus spreads onto the mold compound 24, as indicated by 19D in FIG. 3. This increases the available surface area to contact with the RF shield. The metal plating 19 may also smear and thus spread onto portions of the segmented metal traces 16A that have become exposed during the singulation process, also indicated by 19D in FIG. 3.

If segmented metal traces 16B have metal plating 19, the metal plating 19 also has a tendency to smear and thus spread thereby increasing the available surface area to contact with the RF shield. Thus, during singulation, the metal plating 19 has a tendency to smear and thus spreads onto the insulation layer 14, as indicated by 19C in FIGS. 1 and 3. This increases the available surface area to contact with the RF shield. The metal plating 19 may also smear and thus spread onto portions of the segmented metal traces 16B that have become exposed during the singulation process, also indicated by 19C in FIG. 3.

A conductive coating 26 may then be applied to the device 10A. The conductive coating 26 may be used to provide EMI shielding for the device 10A. The conductive coating 26 may be applied by plating, vacuum printing, vacuum deposition, insert molding, spray coating, and the like. The conductive coating 26 may be applied to the top surface of the mold compound 24. The conductive coating 26 may also be applied to side surfaces of the mold compound 24 and to side surfaces of the substrate 12. The conductive coating 26 may be attached to the exposed areas of the segmented metal traces 16A and 16B and to the metal plating 19 both of which will be grounded. Thus, the device 10A will have a conductive material 26 that contacts grounded metal.

A non-conductive coating 28 may be applied to the conductive coating 26. The non-conductive coating 28 may be used as a protective layer to protect the conductive coating 26 and hence the device 10A from solvents, solders, fluxes, scratches, etc.

Electrical contacts 30 may be coupled to a second surface of the substrate 16. The electrical contacts 30 may be a plurality of solder balls as shown in FIG. 1, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Figure 4A:
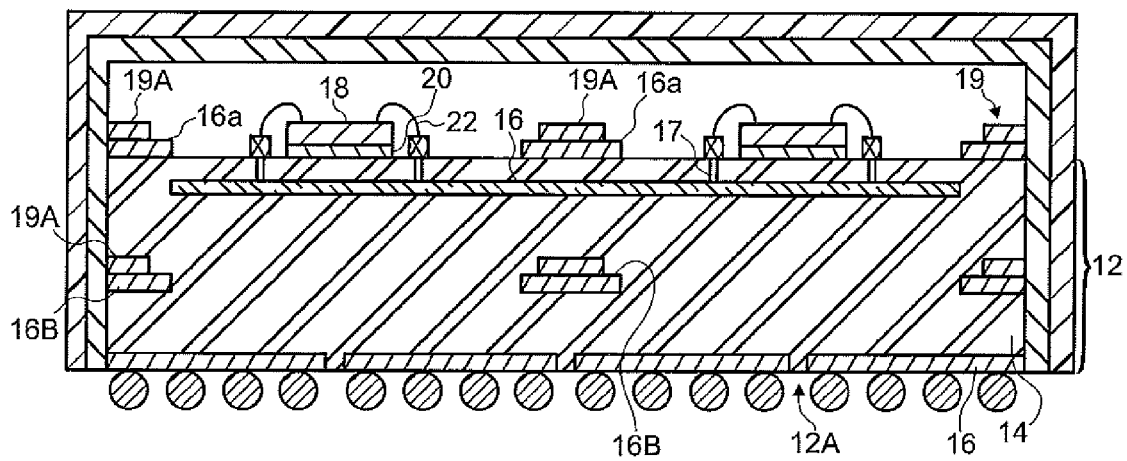
FIGS. 4A-4C shows a process of forming the semiconductor device of FIG. 1.
Figure 4C:
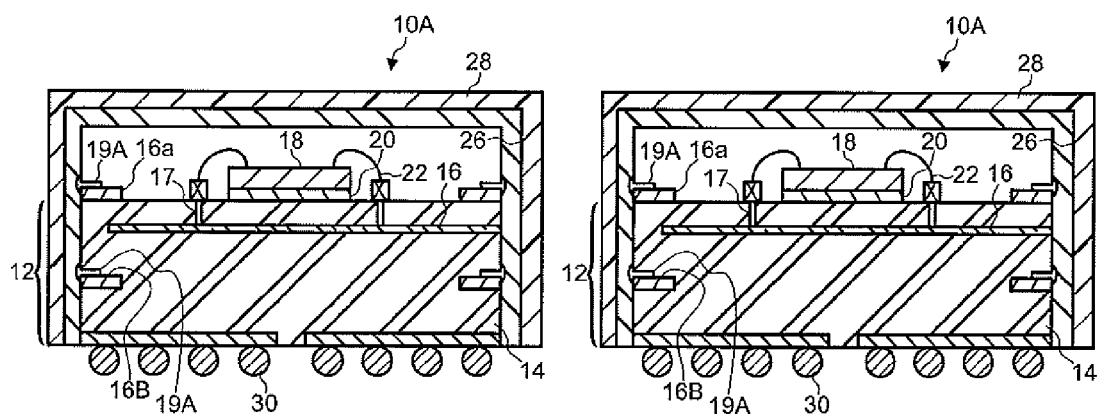
Figure 4B:
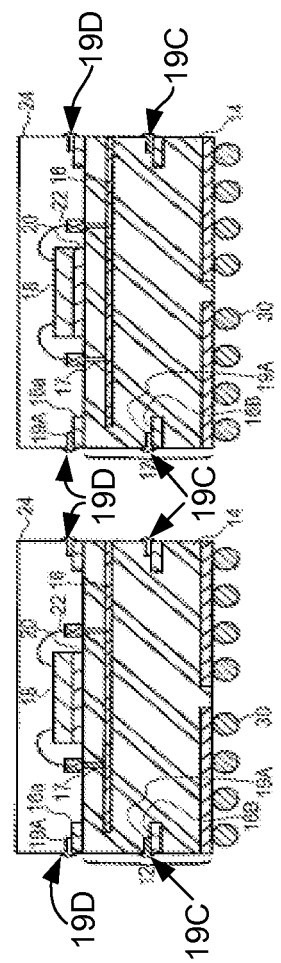

Referring to FIGS. 4A-4C, a method of forming the device 10A is shown. The device 10A may be assembled in strip fashion. Thus, a plurality of devices 10A may be formed from a single substrate strip 12A. As shown in FIG. 4A, the substrate strip 12A has the same basic structure as the substrate 12. The substrate 12 may include an insulation layer 14. The substrate 12 may have a plurality of metal traces 16 formed on the first surface of the insulation layer 14. A plurality of metal traces 16 may also be formed on the second surface of the insulation layer 14. The number of metal traces 16 is not limited to the number shown in the FIGS. 4A-4C. If multiple layers of metal traces 16 are formed, a dielectric layer may be applied between the metal traces 16. The dielectric layer may be used as an insulating layer to separate two signal layers. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

A plurality of segmented metal traces 16A may be formed around a perimeter of a first surface of the substrate 12. Segmented metal traces 16B may also be formed within the insulation layer 14 of the substrate 12 around a perimeter of the device 10A. The segmented metal traces 16A and 16B may be used to connect the RF shield to ground.

Metal plating 19 may be applied to the segmented metal traces 16A. The metal plating 19 may be applied to a top surface of the segmented metal traces 16A on the terminal ends thereof. The metal plating 19 may be used to lower the electrical resistance of the RF shield to ground by lowering the contact resistance. The metal plating 19 may be a noble metal 19A. Noble metals are metals that are resistant to corrosion and oxidation and thus have inherently low electrical resistance which in turn lowers the contact resistance to the RF shield. Some examples of noble metals include but are not limited to: gold, silver, platinum, nickel, and combinations thereof.

The metal plating 19 may also be applied to the segmented metal traces 16B formed within the insulation layer 14 of the substrate 12. The metal plating 19 may be applied to a top surface of the segmented metal traces 16B on the terminal ends thereof. However, since the segmented metal traces 16B formed within the insulation layer 14 of the substrate 12, the metal plating 19 is generally applied during the formation of the substrate 12. In contrast, the metal plating 19 may be applied to the segmented metal traces 16A after the substrate 12 has been produced. Thus, the metal plating 19 may be applied to the segmented metal traces 16A by the packaging company of the device 10A.

One or more die 18 may be attached to a first surface of the first substrate 12. The die 18 may be coupled to the first surface of the first substrate 12 in a plurality of different manners. In accordance with one embodiment, an adhesive 20 may be used to couple the die 18 to the first substrate 12. The die 18 is then electrically coupled to the first substrate 12 through the use of wirebonds 22. Alternatively, the die 18 may be coupled to the substrate 12 through flip chip bonding, surface mount technology (SMT) or the like.

A mold compound 24 may be used to encapsulate the device 10A. The mold compound 24 may be made of a thermosetting plastic material like epoxy. The mold compound 24 may be used to encapsulate the components of the device 10A (i.e., die 18, the wirebonds 22, and exposed areas of the first surface of the substrate 12).

Electrical contacts 30 may be coupled to a second surface of the substrate 16. The electrical contacts 30 may be a plurality of solder balls as shown in FIG. 4A, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

As shown in FIG. 4B, the devices 10A are singulated. In accordance with one embodiment, the devices 10A may be singulated by using a saw to cut between adjacent devices 10A. During the singulation process, the rotation of the saw blade causes the metal plating 19 to smear and thus spreads onto the mold compound 24, as indicated by 19D. This increases the available surface area to contact with the RF shield. The metal plating 19 may also smear and thus spread onto portions of the segmented metal traces 16A that have become exposed during the singulation process, also indicated by 19D.

If the segmented metal traces 16B have metal plating 19, the metal plating 19 also has a tendency to smear and thus spread thereby increasing the available surface area to contact with the RF shield. Thus, during singulation, the metal plating 19 on the segmented metal traces 16B has a tendency to smear and thus spreads onto the insulation layer 14, as indicated by 19C in FIG. 4B. This increases the available surface area to contact with the RF shield. The metal plating 19 may also smear and thus spread onto portions of the segmented metal traces 16B that have become exposed during the singulation process, also indicated by 19C in FIG. 4B.

If the segmented metal traces 16B have metal plating 19, the metal plating 19 also has a tendency to smear and thus spread thereby increasing the available surface area to contact with the RF shield. Thus, during singulation, the metal plating 19 on the segmented metal traces 16B has a tendency to smear and thus spreads onto the insulation layer 14. This increases the available surface area to contact with the RF shield. The metal plating 19 may also smear and thus spread onto portions of the segmented metal traces 16B that have become exposed during the singulation process.

Referring to FIG. 4C, a conductive coating 26 may then be applied to the device 10A. The conductive coating 26 may be used to provide EMI shielding for the device 10A. The conductive coating 26 may be applied by plating, vacuum printing, vacuum deposition, insert molding, spray coating, and the like. The conductive coating 26 may be applied to the top surface of the mold compound 24. The conductive coating 26 may also be applied to side surfaces of the mold compound 24 and to side surfaces of the substrate 12. The conductive material 26 may be applied so that the conductive material 26 will be in contact with the exposed segmented metal traces 16A and 16B as well as the metal plating 19. Thus, the semiconductor device 10A will have a conductive material 28 that contacts grounded metal.

A non-conductive coating 28 may be applied to the conductive coating 26. The non-conductive coating 28 may be used as a protective layer to protect the conductive coating 26 and hence the device 10A from solvents, solders, fluxes, etc.

Figure 5:
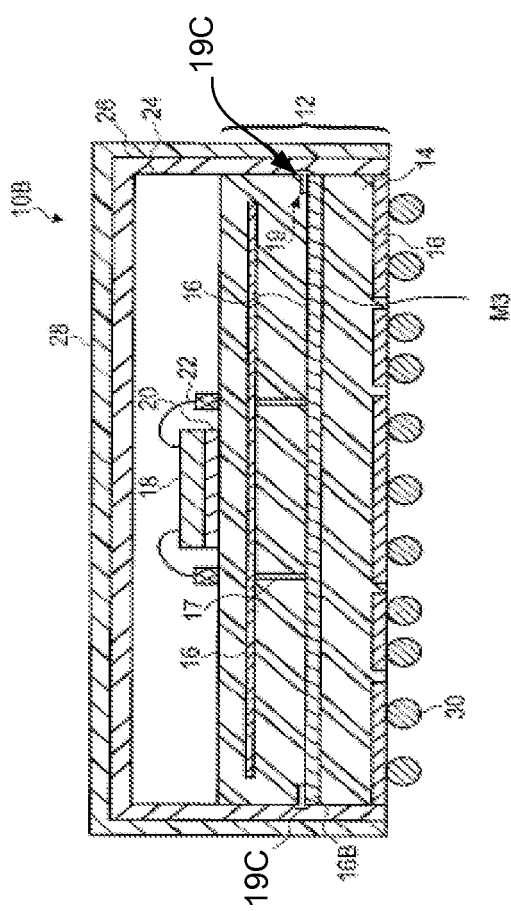
FIG. 5 is a cross-sectional side view of another embodiment of the semiconductor device of the present invention.

Referring to FIG. 5, another embodiment of the device 10B is shown. The device 10B may have a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. Metal traces 16 may also be formed within the insulation layer 14. In the present embodiment, four layers of metals traces 16 are shown. However, the number of metal traces 16 is not limited to the number shown in the FIG. 5. A dielectric layer may be applied between the multiple layers of metal traces 16. The dielectric layer may be used as an insulating layer to separate two signal layers. A soldermask may be placed over the top surface of the metal traces 16 formed on the substrate 12. The soldermask may be used to protect the metal traces 16. One or more vias 17 may be formed through the insulation layer 14. The vias 17 may be used as an interconnect to connect different layers of metal traces 16.

Metal plating 19 may be applied to one of the metal traces 16 formed within the insulation layer 14. In the present embodiment, the metal plating 19 is applied to a top surface of the third layer M3 metal trace 16 on the terminal ends thereof. The metal plating 19 may be used to lower the electrical resistance of the RF shield to ground by lowering the contact resistance. In accordance with one embodiment, the metal plating 19 may be a noble metal 19A or combination of noble metals. The metal plating 19 is generally a softer metal that that of the segmented metal traces 16A. Thus, when the device 10A is singulated, the metal plating 19 has a tendency to smear and thus spread thereby increasing the available surface area to contact with the RF shield as will be discussed below.

One or more die 18 may be attached to a first surface of the first substrate 12. The die 18 may be coupled to the first surface of the first substrate 12 in a plurality of different manners. In the embodiment shown in FIG. 5, an adhesive 20 may be used to couple the electronic components 18 to the first substrate 12. The adhesive 20 may be an adhesive film, an epoxy, or the like. The listing of the above adhesive types should not be seen as to limit the scope of the present invention. The die 18 may then be electrically coupled to the first substrate 12 through the use of wirebonds 22. Alternatively, the electronic components 18 may be coupled to the substrate 12 through flip chip bonding, surface mount technology (SMT) or the like.

A mold compound 24 may be used to encapsulate the device 10B. The mold compound 24 may be made of a thermosetting plastic material like epoxy. The mold compound 24 may be used to encapsulate the components of the device 10*b* (i.e., die 18, the wirebonds 22, and exposed areas of the first surface of the substrate 12).

As previously stated, when the device 10B is singulated, the metal plating 19 has a tendency to smear and thus spread thereby increasing the available surface area to contact with the RF shield. Thus, during singulation, the metal plating 19 has a tendency to smear and thus spreads onto the insulation layer 14, as indicated by 19C in FIG. 5. This increases the available surface area to contact with the RF shield. The metal plating 19 may also smear and thus spread onto portions of the metal trace 16B that have become exposed during the singulation process, also indicated by 19C in FIG. 5.

A conductive coating 26 may then be applied to the device 10B. The conductive coating 26 may be used to provide EMI shielding for the device 10A. The conductive coating 26 may be applied by plating, vacuum printing, vacuum deposition, insert molding, spray coating, and the like. The conductive coating 26 may be applied to the top surface of the mold compound 24, to the side surfaces of the mold compound 24 and to side surfaces of the substrate 12. The conductive coating 26 may be attached to the exposed areas of the metal traces 16 of layer M3 and to the metal plating 19 both of which will be grounded. Thus, the device 10B will have a conductive material 26 that contacts grounded metal.

A non-conductive coating 28 may be applied to the conductive coating 26. The non-conductive coating 28 may be used as a protective layer to protect the conductive coating 26 and hence the device 10B from solvents, solders, fluxes, etc.

Electrical contacts 30 may be coupled to a second surface of the substrate 16. The electrical contacts 30 may be a plurality of solder balls as shown in FIG. 5, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Figure 6:
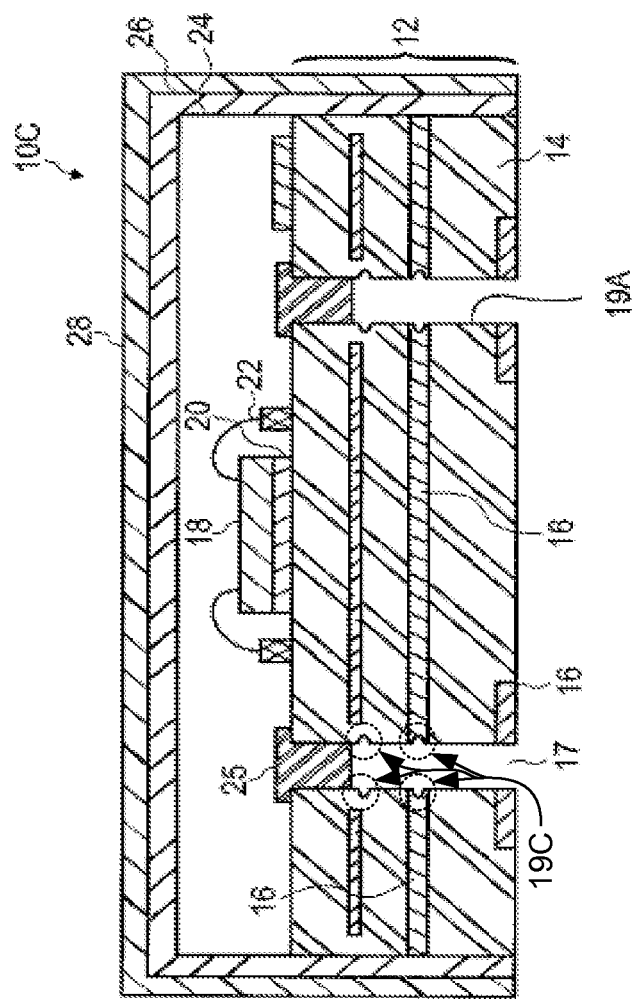
FIG. 6 is a cross-sectional side view of another embodiment of the semiconductor device of the present invention.
Figure 7:
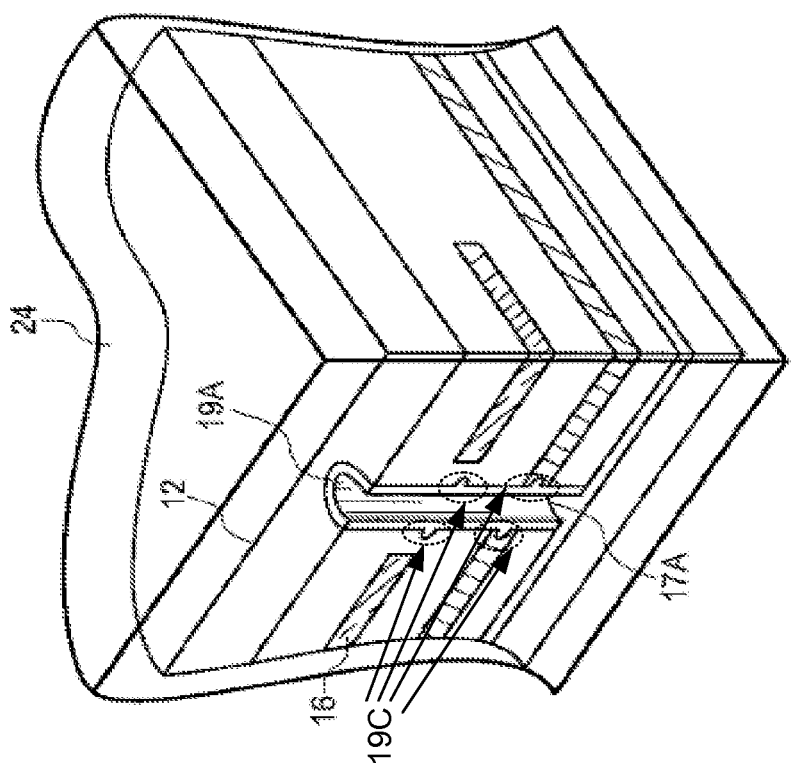
FIG. 7 is a magnified elevated perspective view of a section of the semiconductor device of FIG. 6 with the mold compound removed.

Referring now to FIGS. 6 and 7, another embodiment of the device 10C is shown. The device 10C may have a substrate 12. The substrate 12 may include an insulation layer 14 having predetermined area and thickness. The insulation layer 14 may have an approximately planar first surface and an approximately planar second surface opposing the first surface. The substrate 12 may have a plurality of metal traces 16 formed on the first surface of the insulation layer 14. A plurality of metal traces 16 may also be formed on the second surface of the insulation layer 14. Metal traces 16 may also be formed within the insulation layer 14. In the present embodiment, four layers of metals traces 16 are shown. However, the number of metal traces 16 is not limited to the number shown in the FIGS. 6 and 7. A dielectric layer may be applied between the multiple layers of metal traces 16. The dielectric layer may be used as an insulating layer to separate two signal layers. A soldermask may be placed over the top surface of the metal traces 16 formed on the substrate 12. The soldermask may be used to protect the metal traces 16.

One or more vias 17 may be formed through the insulation layer 14. The vias 17 may be used as an interconnect to different layers of metal traces 16. In the present embodiment, vias 17 may be formed through the insulation layer 14 and around a perimeter of the device 10C. Metal plating 19 may be applied to the interior of the vias 17. The metal plating 19 may be used to lower the electrical resistance of the RF shield to ground by lowering the contact resistance. In accordance with one embodiment, the metal plating 19 is generally a softer metal than that of the metal traces 16. Thus, when the device 10C is singulated, the metal plating 19 has a tendency to smear and thus spread thereby increasing the available surface area to contact with the RF shield as will be discussed below. Thus, the metal plating 19 may spread onto the insulation layer 14 and onto the metal traces 16, as indicated by 19C in FIG. 6. As shown more clearly in FIG. 7, when the device 10C is singulated, the vias 17 are cut to form a U-shaped channel 17A wherein an interior of the U-shaped channel is exposed. The interior of the U-shaped channel 17A has metal plating 19 applied thereto. As stated before, when the device 10C is singulated, the metal plating 19 has a tendency to smear and thus spread thereby increasing the available surface area to contact with the RF shield as will be discussed below. Thus, the metal plating 19 may spread onto the insulation layer 14 and unto the metal traces 16, as indicated by 19C in FIGS. 6 and 7.

One end of the vias 17 may be plugged. The vias 17 may be plugged to prevent unintended elements from entering the vias 17. In general, a soldermask 25 may be used to plug the vias 17. In accordance with one embodiment, a top section of the vias 17 may be plugged with the soldermask 25. The soldermask 25 may be used to prevent mold compound from entering the vias 17 during encapsulation.

One or more die 18 may be attached to a first surface of the first substrate 12. The die 18 may be coupled to the first surface of the first substrate 12 in a plurality of different manners. In the embodiment shown in FIGS. 6 and 7, an adhesive 20 may be used to couple the electronic components 18 to the first substrate 12. The adhesive 20 may be an adhesive film, an epoxy, or the like. The listing of the above adhesive types should not be seen as to limit the scope of the present invention. The die 18 may then be electrically coupled to the first substrate 12 through the use of wirebonds 22. Alternatively, the electronic components 18 may be coupled to the substrate 12 through flip chip bonding, surface mount technology (SMT) or the like.

A mold compound 24 may be used to encapsulate the device 10C. The mold compound 24 may be made of a thermosetting plastic material like epoxy. The mold compound 24 may be used to encapsulate the components of the device 10C (i.e., die 18, the wirebonds 22, and exposed areas of the first surface of the substrate 12).

As previously stated, when the device 10C is singulated, the metal plating 19 has a tendency to smear and thus spread thereby increasing the available surface area to contact with the RF shield. Thus, during singulation, the metal plating 19 has a tendency to smear and thus spreads onto the insulation layer 14, as indicated by 19C in FIGS. 6 and 7. This increases the available surface area to contact with the RF shield.

A conductive coating 26 may then be applied to the device 10C. The conductive coating 26 may be used to provide EMI shielding for the device 10C. The conductive coating 26 may be applied by plating, vacuum printing, vacuum deposition, insert molding, spray coating, and the like. The conductive coating 26 may be applied to the top surface of the mold compound 24, to the side surfaces of the mold compound 24 and to side surfaces of the substrate 12. The conductive coating 26 may be attached to the exposed areas of the metal traces 16 of layer M3 and to the metal plating 19 both of which will be grounded. Thus, the device 10C will have a conductive material 26 that contacts grounded metal.

A non-conductive coating 28 may be applied to the conductive coating 26. The non-conductive coating 28 may be used as a protective layer to protect the conductive coating 26 and hence the device 10B from solvents, solders, fluxes, etc.

Electrical contacts may be coupled to a second surface of the substrate 16. The electrical contacts may be a plurality of solder balls, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

Figure 8A:
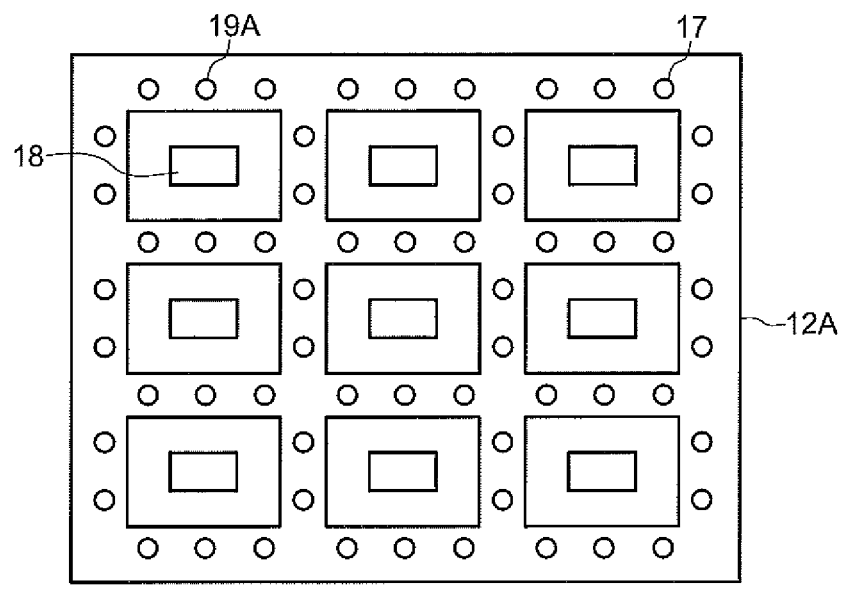
FIGS. 8A-8C is a shows a process of forming the semiconductor device of FIG. 6.
Figure 8B:
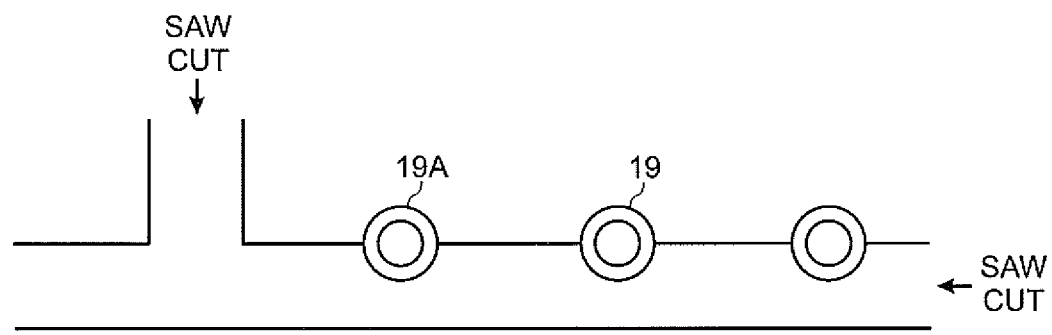
Figure 8C:
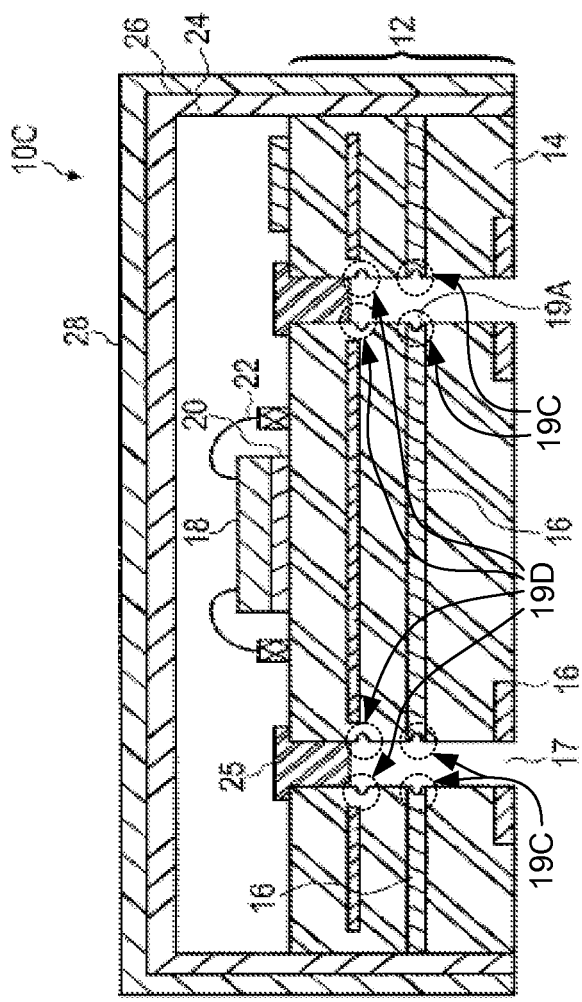

Referring to FIGS. 8A-8C, a method of forming the device 10C is shown. As shown in FIG. 8A, the device 10C may be assembled in strip fashion. Thus, a plurality of devices 10C may be formed from a single substrate strip 12A. The substrate strip 12A has the same basic structure of the substrate 12. As shown in FIG. 8A, a plurality of vias 17 may be formed around a perimeter of each device 10C on the substrate strip 12A. Metal plating 19 may be applied to an interior of the vias 17. The metal plating 19 may be used to lower the electrical resistance of the RF shield to ground by lowering the contact resistance. The metal plating 19 may be a noble metal 19A.

As shown more clearly in FIG. 8C, one or more die 18 may be attached to a first surface of the substrate 12. The die 18 may be coupled to the first surface of the substrate 12 in a plurality of different manners. In accordance with one embodiment, an adhesive 20 may be used to couple the die 18 to the first substrate 12. The die 18 is then electrically coupled to the first substrate 12 through the use of wirebonds 22. Alternatively, the die 18 may be coupled to the substrate 12 through flip chip bonding, surface mount technology (SMT) or the like.

A mold compound 24 may be used to encapsulate the device 10C. The mold compound 24 may be made of a thermosetting plastic material like epoxy. The mold compound 24 may be used to encapsulate the components of the device 10C (i.e., die 18, the wirebonds 22, and exposed areas of the first surface of the substrate 12).

Electrical contacts may be coupled to a second surface of the substrate 16. The electrical contacts may be a plurality of solder balls, a plurality of leads, or the like. If solder balls are used, the solder balls may be electrically coupled to the second surface of the substrate 12. In general, a reflow process may be used to couple the solder balls to the second surface of the substrate 12. Alternative methods may be used to couple the leads to the substrate 16 without departing from the spirit and scope of the present invention.

The devices 10C are then singulated. In accordance with one embodiment, the devices 10C may be singulated by using a saw to cut between adjacent devices 10C. As shown more clearly in FIG. 8B, the saw blade cuts between the adjacent devices 100 and through the vias 17. Thus, the saw blade segments the vias 17 approximately in half to form a U-shaped channels 17A wherein the interior sections of the U-shaped channels 17A are exposed. The interior of the U-shaped channel 17A has the metal plating 19 applied thereto. During the singulation process, the rotation of the saw blade causes the metal plating 19 to smear and thus spread onto the insulation layer 14 of the substrate 12, as indicated by 19D in FIG. 8C. This increases the available surface area to contact the RF shield. The metal plating 19 may also smear and thus spread onto portions of the metal traces 16 that have become exposed during the singulation process, as indicated by 19C in FIG. 8C.

Referring to FIG. 8C, a conductive coating 26 may then be applied to the device 10A. The conductive coating 26 may be used to provide EMI shielding for the device 10A. The conductive coating 26 may be applied by plating, vacuum printing, vacuum deposition, insert molding, spray coating, and the like. The conductive coating 26 may be applied to the top surface of the mold compound 24. The conductive coating 26 may also be applied to side surfaces of the mold compound 24 and to side surfaces of the substrate 12. The conductive material 26 may be applied so that the conductive material 26 will be in contact with the exposed metal traces 16 as well as the metal plating 19. Thus, the semiconductor device 10C will have a conductive material 28 that contacts grounded metal.

A non-conductive coating 28 may be applied to the conductive coating 26. The non-conductive coating 28 may be used as a protective layer to protect the conductive coating 26 and hence the device 10A from solvents, solders, fluxes, etc.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
a substrate having a plurality of metal traces;
a die electrically attached to a first surface of the substrate;
a first plurality of segmented metal traces formed around a perimeter of the first surface of the substrate, wherein a side surface of the first plurality of segmented metal traces is exposed;
a mold compound for encapsulating the semiconductor device;
a first metal plating formed on a top surface end section of the first plurality of segmented metal traces, wherein the first metal plating also extends above and below the top surface end section along the side surface of the first plurality of segmented metal traces which is exposed, wherein the side surface is approximately perpendicular to the top surface;
a conductive coating conformally covering the mold compound, the exposed end sections of the first plurality of segmented metal traces and to the first metal plating.

2. A semiconductor device in accordance with claim 1, wherein the first metal plating is formed of a noble metal.

3. A semiconductor device in accordance with claim 1, further comprising a second plurality of segmented metal traces formed within an insulation layer of the substrate around a perimeter of the substrate, wherein an end section of the second plurality of segmented metal traces is exposed.

4. A semiconductor device in accordance with claim 2, wherein the conductive coating is applied to the mold compound, the exposed end sections of the first plurality of segmented metal traces, the first metal plating, and the exposed end sections of the second plurality of segmented metal traces.

5. A semiconductor device in accordance with claim 3, further comprising a second metal plating formed on a top terminal end section of the second plurality of segmented metal traces, wherein the second metal plating is spread to at least one of the insulation layer or the exposed end sections of the second plurality of segmented metal traces.

6. A semiconductor device in accordance with claim 5, wherein the second metal plating is formed of a noble metal.

7. A semiconductor device in accordance with claim 5, wherein the conductive coating is applied to the mold compound, the exposed end sections of the first plurality of segmented metal traces, the first metal plating; the exposed end sections of the second plurality of segmented metal traces, and the second metal plating.

8. A semiconductor device in accordance with claim 1, further comprising a non-conductive coating applied to the conductive coating.

9. A semiconductor device comprising:
a substrate having a plurality of metal traces; at least one die electrically attached to a first surface of the substrate;
a plurality of vias formed around a perimeter of the first surface of the substrate, the plurality of vias formed through the substrate, an interior of the plurality of vias being exposed along a side surface of the semiconductor device;
a mold compound for encapsulating the semiconductor device;
a metal plating formed on the interior of the plurality of vias, wherein the metal plating also extends onto one or more of the metal traces and an insulating layer adjacent to the plurality of vias;
a conductive coating conformally covering the mold compound and exposed metal traces.

10. A semiconductor device in accordance with claim 9, wherein the metal plating is formed of a noble metal.

11. A semiconductor device in accordance with claim 9, further comprising a plug positioned in a top section of the plurality of vias.

12. A semiconductor device in accordance with claim 11, wherein the plug is formed of soldermask.

13. A semiconductor device in accordance with claim 9, further comprising a non-conductive coating applied to the conductive coating.

14. A method of making a semiconductor device comprising:
providing a substrate having a plurality of metal traces, a first plurality of segmented metal traces formed around a perimeter of the first surface of the substrate, wherein a side surface of the first plurality of segmented metal traces is exposed;
attaching a die electrically to a first surface of the substrate;
applying a first metal plating on a top surface end section of the first plurality of segmented metal traces, wherein the top surface is approximately perpendicular to the side surface;
encapsulating the semiconductor device with a mold compound;
applying a conductive coating to the mold compound, the exposed side surface of the first plurality of segmented metal traces and to the first metal plating, wherein the first metal plating is spread to extend above and below the top surface end section along the exposed side surface of the first plurality of segmented metal traces.

15. The method of claim 14, wherein applying the first metal plating further comprises applying the first metal layer which is formed of a noble metal.

16. The method of claim 14, wherein providing the substrate further comprises providing a substrate having a second plurality of segmented metal traces formed within an insulation layer of the substrate around a perimeter of the substrate, wherein an end section of the second plurality of segmented metal traces is exposed.

17. The method of claim 16, wherein applying the conductive coating further comprises applying the conductive coating to the mold compound, the exposed end sections of the first plurality of segmented metal traces, the first metal plating, and the exposed end sections of the second plurality of segmented metal traces.

18. The method of claim 16, further comprising applying a second metal plating formed on a top terminal end section of the second plurality of segmented metal traces, wherein the second metal plating is spread to at least one of the insulation layer or the exposed end sections of the second plurality of segmented metal traces.

19. The method of claim 18, wherein applying the conductive coating further comprises applying the conductive coating to the mold compound, the exposed end sections of the first plurality of segmented metal traces, the first metal plating; the exposed end sections of the second plurality of segmented metal traces, and the second metal plating.

20. The method of claim 14, further comprising applying a non-conductive coating to the conductive coating.

* * * * *